United States Patent
Caminada et al.

(10) Patent No.: US 7,446,611 B2
(45) Date of Patent: Nov. 4, 2008

(54) FULLY DIFFERENTIAL AMPLIFIER DEVICE WITH OUTPUT-COMMON-MODE FEEDBACK AND CONTROL METHOD THEREOF

(75) Inventors: Carlo Caminada, Rho (IT); Ernesto Lasalandra, S. Donato Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 135 days.

(21) Appl. No.: 11/388,249

(22) Filed: Mar. 23, 2006

(65) Prior Publication Data

US 2006/0232337 A1    Oct. 19, 2006

(30) Foreign Application Priority Data

Mar. 25, 2005   (IT)   ............................ TO2005A0195

(51) Int. Cl.
    *H03F 3/45*   (2006.01)
    *H03F 1/02*   (2006.01)
(52) U.S. Cl. .......................................... 330/260; 330/9
(58) Field of Classification Search .................. None
    See application file for complete search history.

(56) References Cited

U.S. PATENT DOCUMENTS

| | | | | |
|---|---|---|---|---|
| 5,565,813 A * | 10/1996 | Connell et al. ................. 330/9 |
| 5,610,547 A * | 3/1997 | Koyama et al. ............. 327/350 |
| 6,529,075 B2 * | 3/2003 | Bruck et al. ................. 330/252 |
| 6,720,830 B2 * | 4/2004 | Andreou et al. ............. 330/253 |
| 6,812,784 B2 * | 11/2004 | Michalski ....................... 330/9 |
| 6,850,378 B2 * | 2/2005 | Conteras et al. ............... 360/46 |
| 6,985,038 B2 * | 1/2006 | Miwa et al. .................. 330/258 |
| 7,129,782 B2 * | 10/2006 | Lebedev et al. ............. 330/258 |
| 2006/0186954 A1 * | 8/2006 | Koller et al. .................... 330/9 |
| 2007/0085608 A1 * | 4/2007 | Iriguchi et al. .............. 330/260 |

* cited by examiner

Primary Examiner—Robert J. Pascal
Assistant Examiner—Krista M Flanagan
(74) Attorney, Agent, or Firm—Lisa K. Jorgenson; Andy M. Han; Seed IP Law Group PLLC

(57) ABSTRACT

A fully differential amplifier device includes a first input and a second input, a first output and a second output, and a differential input stage, provided with a first input transistor and a second input transistor. The first input and the first output and the second input and the second output are directly connected selectively in a first operating configuration and disconnected in a second operating configuration. The amplifier device further includes a current-generator circuit connected so as to supply respective first currents to the first and second outputs irrespective of a state of conduction of the first and second input transistors.

16 Claims, 4 Drawing Sheets

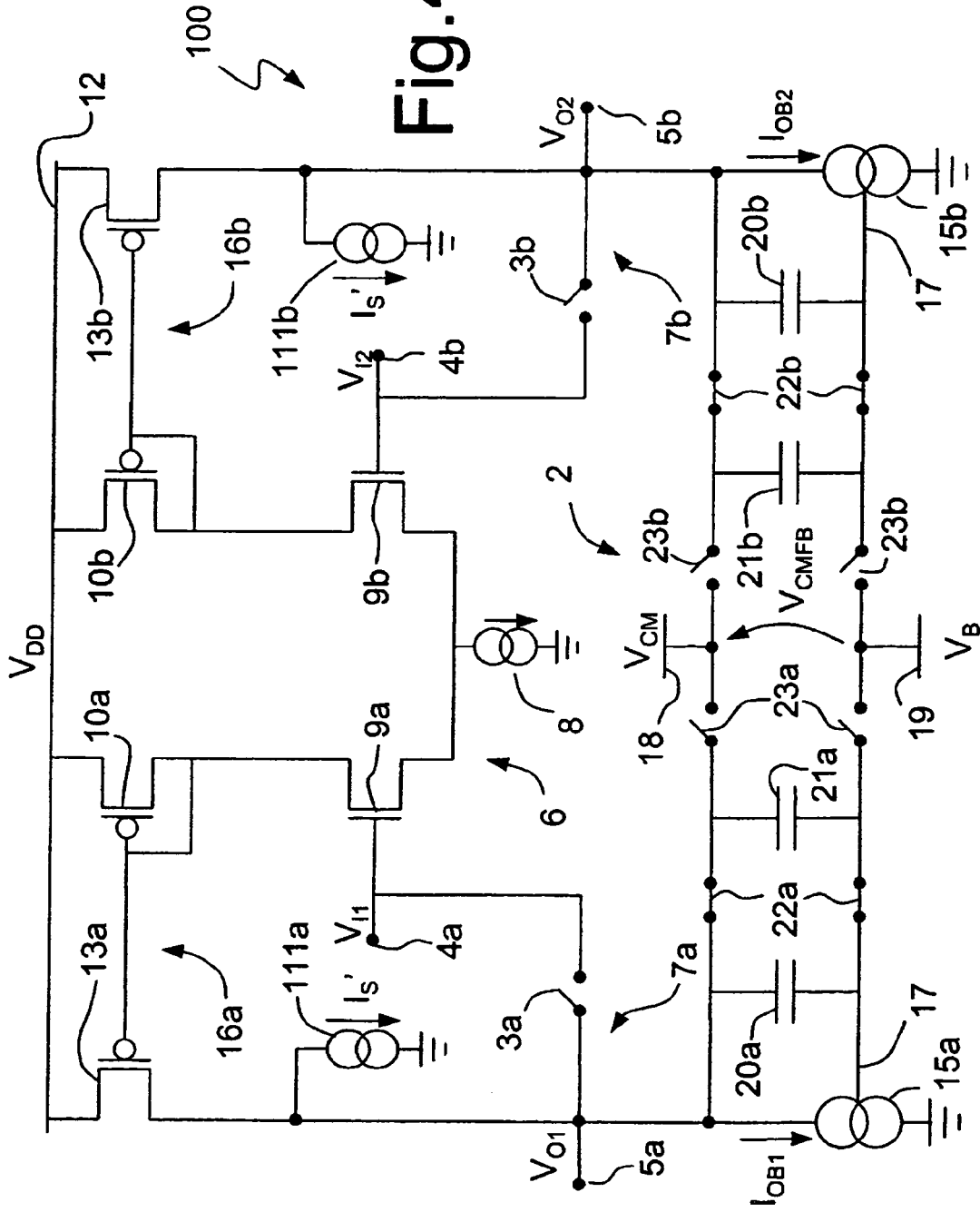

FULLY DIFFERENTIAL AMPLIFIER DEVICE WITH OUTPUT-COMMON-MODE FEEDBACK AND CONTROL METHOD THEREOF

BACKGROUND OF THE INVENTION

1. Field of the Invention

The present invention relates to a fully differential amplifier device, in particular of the type with output-common-mode feedback, and to a control method thereof.

2. Description of the Related Art

As is known, the use of fully differential operational amplifiers with switched-capacitor circuits affords important advantages in several applications, especially owing to low levels of consumption and to compatibility with low supply voltages (3 V or even lower).

There are, however, some critical aspects, which can cause serious problems in certain circumstances. In particular, it is known that fully differential operational amplifiers employ output-common-mode-feedback (OCMFB) networks, which fix common-mode working points not only for the inputs, but also for the outputs. The OCMFB networks can be of the switched-capacitor type. In this case, common-mode control envisages a first step (reset), in which a capacitor for each output is charged to a pre-determined voltage, and a second step (active or "sensing" step), in which the charged capacitors are connected to the operational amplifier so that the pre-determined voltage is applied between the outputs and a common-mode-feedback node. In addition, in order to correctly balance the operational amplifier, its inputs and outputs are shorted in the reset step. During power-on or exit from low-consumption wait states ("Power Down", "Deep Power Down"), the short circuit between the inputs and the outputs of the operational amplifier is critical. In fact, it is possible that the outputs of the operational amplifier will be at a zero voltage or in any case at a voltage much lower than the lowest available supply source. Since in the reset step the inputs are forced to the same voltage as the outputs, it might happen that the operational amplifier does not switch on. Obviously, in this situation, the operational amplifier is not able to supply current to the outputs, which remain at a low voltage. Furthermore, the OCMFB network tends disadvantageously to force the feedback node to a negative voltage (lower than the ground voltage or than the lowest available supply source). Switching-on of the operational amplifier can be triggered by random fluctuations, due, for example, to the presence of noise, or by uncontrolled variations of the electrical quantities present. However, the evolution of the state of the operational amplifier is indeterminate: according to random variations in the specific operating conditions, it may happen that the switching-on or restoring time of the operational amplifier is very long, or else even that return to normal operating conditions fails.

In order to solve the problem described, it has been proposed to include in the operational amplifier further control circuitry, which intervenes only in particular operating conditions. The solution is not altogether satisfactory because it requires a considerable occupation of area, given a minimum use in terms of time.

BRIEF SUMMARY OF THE INVENTION

One embodiment of the present invention provides a fully differential amplifier device above and a control method thereof that will be free from the drawbacks described.

One embodiment of the invention is a fully differential amplifier device that includes: first and second inputs, first and second outputs, a differential input stage, and a current-generator circuit. The first input and the first output are directly connected selectively in a first operating configuration and disconnected in a second operating configuration, and the second input and the second output are directly connected selectively in the first operating configuration and disconnected in the second operating configuration. The differential input stage includes a first input transistor and a second input transistor and the current-generator circuit is connected so as to supply respective first currents to the first and second outputs irrespective of a state of conduction of the first and second input transistors. One embodiment of the invention is a method for controlling a fully differential amplifier device that includes first and second inputs, and a differential input stage, which includes a first input transistor and a second input transistor. The method includes: directly connecting, in a first operating configuration, the first output to the first input and the second output to the second input; and disconnecting, in a second operating configuration, the first output from the first input and the second output from the second input. The method also includes continuously supplying currents to the first and second outputs, irrespective of a state of conduction of the first and second input transistors.

BRIEF DESCRIPTION OF THE SEVERAL VIEWS OF THE DRAWING(S)

For a better understanding of the invention, some embodiments thereof are now described, purely by way of non-limiting example and with reference to the attached plate of drawings, wherein:

FIG. 4 illustrates the amplifier device of FIG. 3 in a second operating configuration.

DETAILED DESCRIPTION OF THE INVENTION

Figure 1:
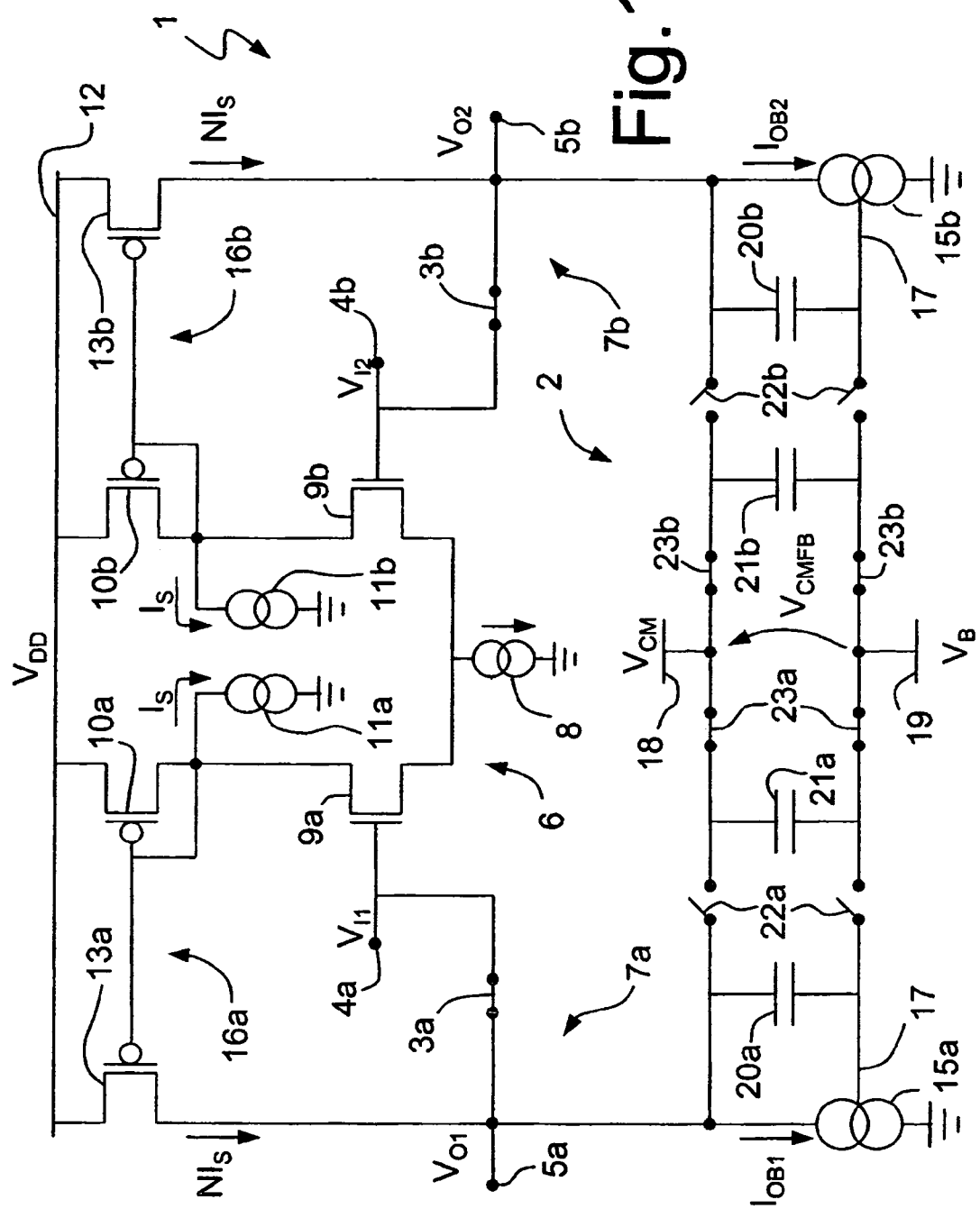
FIG. 1 is a simplified circuit diagram of an amplifier device according to a first embodiment of the present invention, in a first operating configuration.
Figure 2:
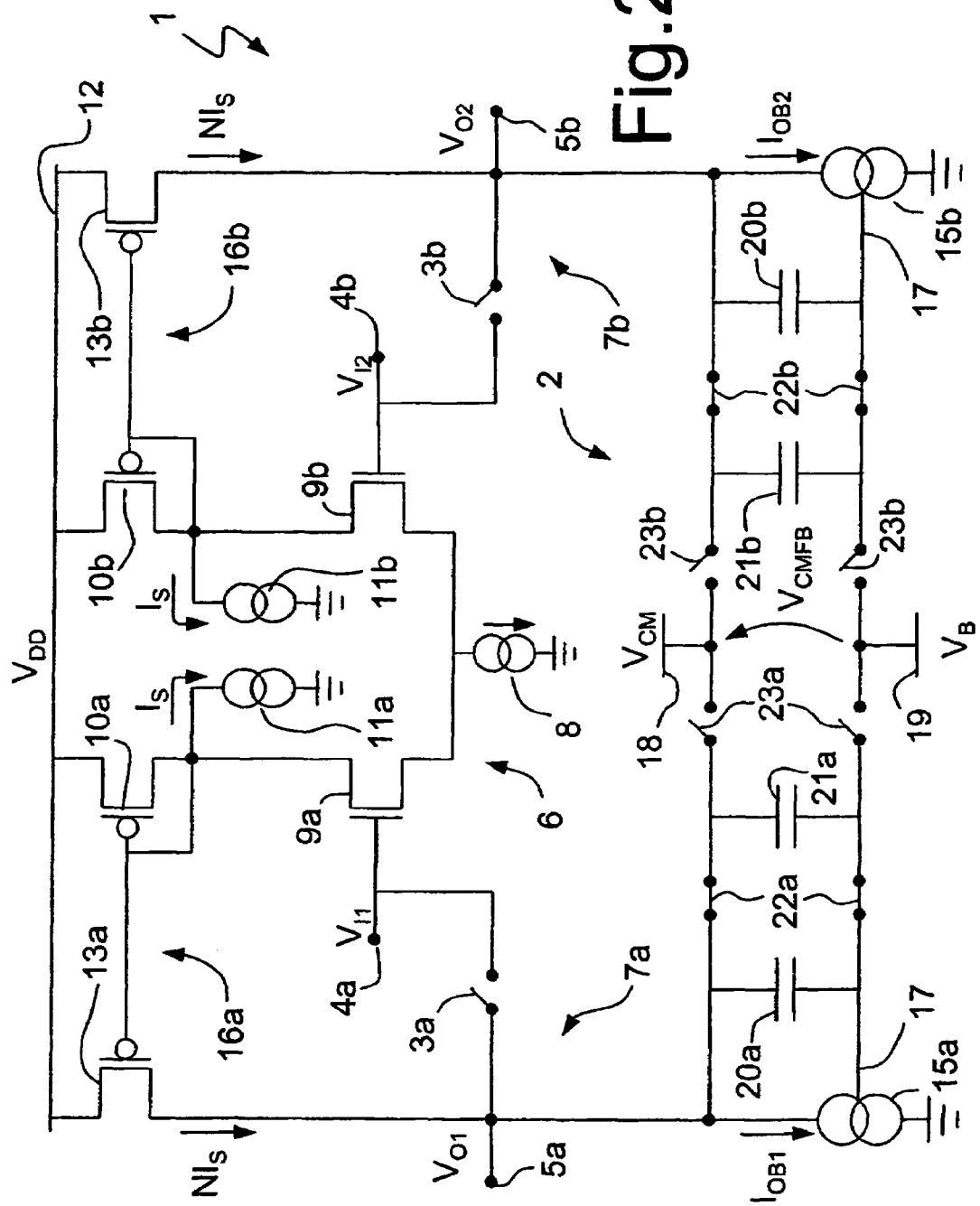
FIG. 2 illustrates the amplifier device of FIG. 1 in a second operating configuration.

In FIGS. 1 and 2, the reference number 1 designates a fully differential operational amplifier, and a switched-capacitor, output-common-mode-feedback (OCMFB) network 2 associated thereto.

The operational amplifier 1 has a first input 4a and a second input 4b and a first output 5a and a second output 5b and comprises a differential input stage 6, as well as a first output stage 7a and a second output stage 7b. Furthermore, the operational amplifier 1 is provided with a first equalization switch 3a, connected between the first input 4a and the first output 5a; and a second equalization switch 3b, connected between the second input 4a and the second output 5a. The first and second reset switches 3a, 3b are controlled in phase by a reset signal RES generated in a known way by an external control unit (not shown).

The differential stage 6 comprises an input current generator 8, a first input transistor 9a and a second input transistor 9b, associated to which are, respectively, a first load transistor 10a and a second load transistor 10b. In addition, the differential stage 6 includes a first start current generator 11a and a second start current generator 11b.

The first and second input transistors 9a, 9b are of an NMOS type and have their gate terminals forming the first input 4a and the second input 4b, respectively, of the operational amplifier 1 and their source terminals connected to a first terminal of the input current generator 8. A second terminal of the input current generator 8 is connected to ground. The first and second load transistors 10a, 10b are of a PMOS type and are arranged in diode configuration, i.e., have their respective gate terminals directly connected to their respective drain terminals. Furthermore, the drain terminals of the first and second load transistors 10a, 10b are connected to the drain terminals of the first input transistor 9a and of the second input transistor 9b, respectively, whereas the source terminals are connected to a supply line 12, which supplies a supply voltage $V_{DD}$ (for example, 2.5 V). The first start current generator 11a is connected between the drain terminal of the first load transistor 10a and ground, and the second start current generator 11b is connected between the drain terminal of the second load transistor 10b and ground. In addition, each of the first and second start current generators 11a, 11b absorb a respective starting current $I_S$ (of a very low value, for example 1 µA) and is always on in the presence of a voltage on the supply line 12 (even a voltage lower than the supply voltage $V_{DD}$). In particular, the first and second start current generators 11a, 11b supply the respective start currents Is irrespective of whether the first and the second input transistors 9a, 9b are in a first state, in which they are on and are conducting (ON state), or in a second state, in which they are inhibited (OFF state).

The first output stage 7a comprises a first output transistor 13a and a first output current generator 15a, and the second output stage 7b comprises a second output transistor 13b and a second output current generator 15b. The first and second output transistors 13a, 13b are connected to the first and second load transistors 10a, 10b so as to form, respectively, a first current mirror 16a and a second current mirror 16b. More precisely, the gate terminals of the first and second output transistors 13a, 13b are connected to the gate terminals of the first load transistor 10a and of the second load transistor 10b, respectively, whereas the source terminals are connected to the supply line 12. Furthermore, the first and second output transistors 13a, 13b are so sized that the first and second current mirrors 16a, 16b have mirror ratio higher than one, for example 4:1. Consequently, the currents flowing through the first and second output transistors 13a, 13b are greater than the currents flowing through the first load transistor 10a and the second load transistor 10b, respectively. The drain terminals of the first and second output transistors 13a, 13b form the first output 5a and the second output 5b, respectively, of the operational amplifier 1 and are moreover connected to the first output current generator 15a and to the second output current generator 15b, respectively.

The first and second output current generators 15a, 15b, per se known, have respective control terminals 17. Output biasing currents $I_{BO1}$, $I_{BO2}$ supplied by the first and second output current generators 15a, 15b are correlated to voltages present on the respective control terminals 17.

The OCMFB network 2 comprises a common-mode voltage source 18 and a bias voltage source 19 (which are represented schematically in FIG. 1 as supply lines), a first feedback capacitor 20a, a second feedback capacitor 20b, a first reset capacitor 21a and a second reset capacitor 21b. Furthermore, the OCMFB network 2 includes first and second feedback switches 22a, 22b and first and second reset switches 23a, 23b.

The first feedback capacitor 20a has a first terminal that is selectively connectable to the first output 5a and a second terminal that is selectively connectable to the control terminal 17 of the first output current generator 15a. The first reset capacitor 21a has a first terminal and a second terminal, which are selectively connectable to the first and second terminals of the first feedback capacitor 20a through respective feedback switches 22a. In addition, the first and second terminals of the first reset capacitor 21a are selectively connectable to the common-mode voltage source 18 and to the biasing-voltage source 19 through respective first reset switches 23a.

The second feedback capacitor 20b has a first terminal that is selectively connectable to the second output 5b and a second terminal that is selectively connectable to the control terminal 17 of the second output current generator 15b. The second reset capacitor 21b has a first terminal and a second terminal, which are selectively connectable to the first and the second terminals of the second feedback capacitor 20b through respective second feedback switches 22b. Furthermore, the first and second terminals of the second reset capacitor 21b are selectively connectable to the common-mode voltage source 18 and to the bias voltage source 19 through respective second reset switches 23b.

The first and second reset switches 23a, 23b are controlled by means of the reset signal RES, hence in phase with the first and second equalization switches 3a, 3b. The first and second feedback switches 22a, 22b are, instead, controlled by a negated clock signal CKN, complementary to the direct clock signal CK. Consequently, the first and second feedback switches 22a, 22b are controlled in phase opposition with respect to the first and second equalization switches 3a, 3b and to the first and second reset switches 23a, 23b.

The common-mode source 18 and the bias voltage source 19 supply a common-mode voltage $V_{CM}$ and, respectively, a bias voltage $V_B$, and a difference between them defines a common-mode-feedback voltage $V_{CMFB}$. In particular, the common-mode-feedback voltage $V_{CMFB}$ has a pre-determined value and is the voltage that is applied between the first output 5a and the control terminal 17 of the first output current generator 15a and between the second output 5b and the control terminal 17 of the second output current generator 15b to maintain the outputs 5a, 5b at the correct common-mode voltage (typically equal to half the difference between the maximum and the minimum supply voltages available, in this case $V_{DD}/2$).

Operation of the operational amplifier 1 is described hereinafter. In a first operating step (reset), the equalization switches 3a, 3b and the reset switches 23a, 23b are in a closed condition, whereas the feedback switches 22a, 22b are in an open condition. Consequently, the first and second reset capacitors 21a, 21b are connected in parallel between the common-mode voltage source 18 and the bias voltage source 19 and are charged to the common-mode-feedback voltage $V_{CMFB}$. Furthermore, the first and second inputs 4a, 4b of the operational amplifier 1 are directly connected to the first and second outputs 5a, 5b, respectively.

In a second operating step (active or "sensing" step), all the switches switch. Consequently, the equalization switches 3a, 3b and the reset switches 23a, 23b are in a open condition, whereas the feedback switches 22a, 22b are in a closed condition. Therefore, in this configuration, the first and second reset capacitors 21a, 21b are connected in parallel to the first and second feedback capacitors 20a, 20b, respectively, whereas a first input voltage $V_{I1}$ and a second input voltage $V_{I2}$, of a differential type, are supplied on the first and sesecond inputs 4a, 4b. In response to the first and second input voltages $V_{I1}$, $V_{I2}$, the operational amplifier 1 supplies a first output voltage $V_{O1}$ and a second output voltage $V_{O2}$, which are also of a differential type. A possible common-mode component associated to the first and second output voltages $V_{O1}, V_{O2}$ is compensated by the reset capacitors 21a, 21b. By "common-mode component" is meant herein the difference between the mean value of the first output voltage $V_{O1}$ and that of the second output voltage $V_{O2}$, i.e., $(V_{O1}+V_{O2})/2$, and the common-mode voltage $V_{CM}$. The reset capacitors 21a, 21b impose the common-mode-feedback voltage $V_{CMFB}$ between the first output 5a and the control terminal 17 of the first output current generator 15a and between the second output 5b and the control terminal 17 of the second output current generator 15b. In practice, the output biasing currents $I_{BO1}, I_{BO2}$ supplied by the first and second output current generators 15a, 15b, respectively, are modulated so as to maintain the mean value of the first and second output voltage $V_{O1}, V_{O2}$ equal to the common-mode voltage $V_{CM}$.

On power-on of the operational amplifier 1 or upon exit from low-consumption wait states ("Power Down", "Deep Power Down"), it may happen that the output voltages $V_{O1}$, $V_{O2}$ are substantially zero. Since the first and second outputs 5a, 5b are directly connected respectively to the first input 4a and to the second input 4b, respectively during the reset step, the input transistors 9a, 9b are initially inhibited (second state, OFF). However, the start current generators 11a, 11b are on, are conducting, and recall the start currents Is through the load generators 10a, 10b. The start currents $I_S$ are mirrored and amplified by the current mirrors 16a, 16b. In practice, then, the output transistors 13a, 13b are conducting, and mirrored currents $NI_S$ flow in the output stages 7a, 7b, that cause the first and second output voltages $V_{O1}$, $V_{O2}$ to increase. Furthermore, the mirrored currents $NI_S$ supplied by the output transistors 13a, 13b are higher than the start currents $I_S$ according to the mirror ratio N:1 of the current mirrors 16a, 16b. Also the voltages on the first and second inputs 4a, 4b can increase and very soon will the input transistors 9a, 9b switch on and start conducting (i.e., they switch into the first state, ON). The differential stage 6 hence switches on. In addition, owing to the action of the OCMFB network 2, the voltages on the control terminals 17 of the output current generators 15a, 15b follow the increase of the output voltages $V_{O1}, V_{O2}$, until they become positive and sufficiently high to switch on the output current generators 15a, 15b themselves. The operational amplifier 1 evolves then rapidly towards the normal working configuration.

Advantageously, the start currents $I_S$ enable switching-on of the operational amplifier 1 to be triggered even starting from critical conditions. The normal operating conditions are hence reached in any case within a given switching-on time. In particular, the maximum switching-on time is correlated to the value of the start currents $I_S$ and to the mirror ratio of the current mirrors 16a, 16b. Furthermore, the starting currents $I_S$ are very low and do not affect normal operation of the operational amplifier 1. Also the increase in power consumption and circuit complexity is altogether negligible.

Figure 3:
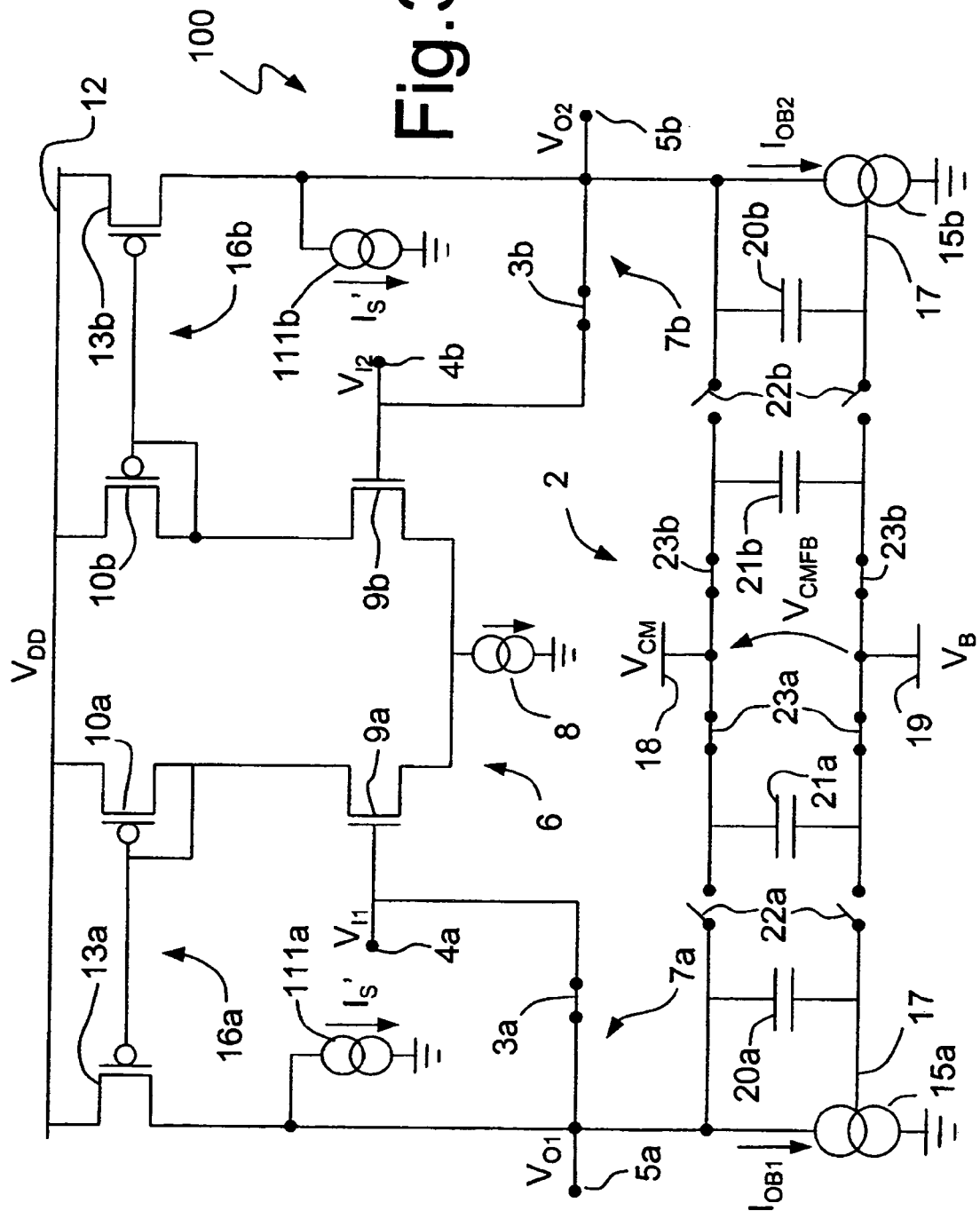
FIG. 3 is a simplified circuit diagram of an amplifier device according to a second embodiment of the present invention, in a first operating configuration.

A different embodiment of the invention is illustrated in FIGS. 3 and 4, where parts that are the same as the ones already shown are designated by the same reference numbers. A fully differential operational amplifier 100, which the OCMFB network 2 is associated to, comprises the differential input stage 6 and the first and second output stages 7a, 7b. The differential stage 6 is coupled to the first and second output stages 7a, 7b by the first and second current mirrors 16a, 16b, respectively, which include the first load transistor 10a and the first output transistor 13a and, respectively, the second load transistor 10b and the second output transistor 13b. A first start current generator 111a and a second start current generator 111b have first terminals connected to the first output 5a and to the second output 5b, respectively, of the operational amplifier 100, and second terminals connected to ground. The first and second start current generators 111a, 111b are always on in the presence of voltage on the supply line 12 (even a voltage lower than the supply voltage $V_{DD}$) and supply respective starting currents $I_S'$ to the outputs 5a, 5b.

In FIG. 3, the operational amplifier 100 is illustrated in the reset configuration, in which the inputs 4a, 4b are directly connected to the outputs 5a, 5b and the reset capacitors 21a, 21b are connected between the common-mode voltage source 18 and the biasing-voltage source 19. FIG. 4 shows, instead, the operational amplifier 100 in the configuration corresponding to the active step, in which the inputs 4a, 4b are disconnected from the outputs 5a, 5b for receiving the input voltages $V_{I1}, V_{I2}$ and the first and second reset capacitors 21a, 21b are connected in parallel to the first and second feedback transistors 20a, 20b, respectively.

In this case, the starting currents $I_S'$ are supplied directly to the output branches 7a, 7b, irrespective of whether the first input transistor and the second input transistor are in the first state, in which they are conducting (ON state), or in the second state, in which they are inhibited (OFF state). When critical conditions arise, in particular with the output voltages $V_{O1}, V_{O2}$ substantially zero, the starting currents $I_S'$ enable increase of the output voltages $V_{O1}, V_{O2}$ and switching-on of the operational amplifier 100.

Finally, it is clear that modifications and variations may be made to the amplifier described herein, without departing from the scope of the present invention, as defined in the annexed claims. In particular, it is clear that the amplifier could be obtained in a dual way, using input transistors of a PMOS type and load transistors and output transistors of an NMOS type.

The invention claimed is:

1. A fully differential amplifier device comprising:
a first input, a second input, a first output, and a second output, wherein the first input and the first output are connected selectively in a first operating configuration and disconnected in a second operating configuration, and the second input and the second output are connected selectively in the first operating configuration and disconnected in the second operating configuration;
a differential input stage, including a first input transistor and a second input transistor; and
a current-generator circuit connected so as to supply respective first currents to said first and second outputs irrespective of a state of conduction of said first and second input transistors, said current-generator circuit comprising a first current generator and a second current generator that are directly connected to said first output and to said second output, respectively.

2. The amplifier device according to claim 1, wherein said differential stage comprises a first load coupled to said first input transistor and coupled to said first output, and a second load coupled to said second input transistor and coupled to said second output.

3. The amplifier device according to claim 2, wherein the current-generator circuit includes a first output transistor and a second output transistor having respective conduction terminals connected to said first output and, respectively, said second output, wherein said first load comprises a first load transistor connected to said first output transistor so as to form a first current mirror, and said second load comprises a second load transistor connected to said second output transistor so as to form a second current mirror.

4. The amplifier device according to claim 2, wherein the current-generator circuit is connected so as to supply respective second currents through said first load and said second load.

5. The amplifier device according to claim 4, wherein said current-generator circuit comprises a first current generator and a second current generator, which are connected to said first load and to said second load, respectively.

6. The amplifier device according to claim 1, comprising a switched-capacitor, output-common-mode-feedback network, for maintaining the first and second outputs at a predetermined common-mode voltage.

7. A method for controlling a fully differential amplifier device, wherein said amplifier device comprises a first input and a second input, a first output and a second output, and a differential input stage, which includes a first input transistor and a second input transistor, the method comprising the steps of:
- connecting, in a first operating configuration, said first output to said first input and said second output to said second input;
- disconnecting, in a second operating configuration, said first output from said first input and said second output from said second input; and
- continuously supplying currents to said first and second outputs, irrespective of a state of conduction of said first and second input transistors, by supplying current to the first output using a first current generator connected directly to the first output and supplying current to the second output using a second current generator connected directly to the second output.

8. The method of claim 7 wherein continuously supplying currents to said first and second outputs includes:
- supplying a first current to the first input transistor;
- mirroring the first current to the first output;
- supplying a second current to the second input transistor; and
- mirroring the second current to the second output.

9. A fully differential amplifier device, comprising:
- a first input, a second input, a first output, and a second output, wherein the first input and the first output are selectively connected to one another, and the second input and the second output are selectively connected to one another;
- a differential input stage including a first input transistor, a first load transistor, a second load transistor, and a second input transistor, the first input transistor and the first load transistor being connected in series, the second input transistor and the second load transistor being connected in series;
- first and second output transistors coupled to the first and second outputs, respectively, the first output transistor being further coupled to the first load transistor to form a current mirror, the second output transistor being further coupled to the second load transistor to form a current mirror; and
- supply means for supplying respective currents to the first and second outputs when the first and second input transistors are turned off.

10. The amplifier device according to claim 9, wherein the supply means are connected so as to supply respective second currents through the first load and the second load.

11. The amplifier device according to claim 10, wherein the supply means comprise a first current generator and a second current generator, which are connected to the first load and to the second load, respectively.

12. The amplifier device according to claim 9, wherein the supply means comprise a first current generator and a second current generator, which are connected to the first load and to the second load, respectively.

13. The amplifier device according to claim 9, wherein the supply means comprise a first current generator and a second current generator, which are directly connected to the first output and to the second output, respectively.

14. The amplifier device according to claim 9, further comprising a switched-capacitor, output-common-mode-feedback network coupled to the first and second outputs and structured to maintain the first and second outputs at a predetermined common-mode voltage.

15. A fully differential amplifier device, comprising:
- a first input, a second input, a first output, and a second output, wherein the first input and the first output are selectively connected to one another, and the second input and the second output are selectively connected to one another;
- a differential input stage including a first input transistor and a second input transistor; and
- supply means for supplying respective currents to the first and second outputs when the first and second input transistors are turned off, the supply means including a first current generator and a second current generator that are directly connected to the first output and to the second output, respectively.

16. The amplifier device according to claim 15, further comprising a switched-capacitor, output-common-mode-feedback network coupled to the first and second outputs and structured to maintain the first and second outputs at a predetermined common-mode voltage.

* * * * *